(12) United States Patent
Sherwin et al.

(10) Patent No.: US 10,466,597 B2
(45) Date of Patent: Nov. 5, 2019

(54) METHODS AND APPARATUS TO CONTROL GRAYSCALE PHOTOLITHOGRAPHY

(71) Applicant: TEXAS INSTRUMENTS INCORPORATED, Dallas, TX (US)

(72) Inventors: Lucius M. Sherwin, Plano, TX (US); Song Zheng, Allen, TX (US); Chris Murray Beard, Allen, TX (US); Noppawan Boorananut, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/800,868

(22) Filed: Nov. 1, 2017

(65) Prior Publication Data

US 2019/0129298 A1    May 2, 2019

(51) Int. Cl.
*G03F 7/20* (2006.01)
*G03F 1/44* (2012.01)
*H01L 21/027* (2006.01)
*B81C 1/00* (2006.01)

(52) U.S. Cl.
CPC ...... *G03F 7/70608* (2013.01); *B81C 1/00404* (2013.01); *G03F 1/44* (2013.01); *G03F 7/20* (2013.01); *H01L 21/0274* (2013.01); *B81C 2201/0157* (2013.01)

(58) Field of Classification Search
CPC ............. G03F 7/70625; G03F 7/70558; G03F 7/70608
See application file for complete search history.

(56) References Cited

U.S. PATENT DOCUMENTS

| | | | |
|---|---|---|---|
| 5,128,232 A * | 7/1992 | Thackeray | G03F 7/0233 430/192 |
| 2002/0006588 A1* | 1/2002 | Afromowitz | G03F 7/2022 430/322 |
| 2002/0072001 A1* | 6/2002 | Brown | G01N 21/47 430/30 |
| 2003/0077525 A1* | 4/2003 | Rettenmaier | G03F 1/44 430/5 |
| 2004/0131946 A1* | 7/2004 | Gil | G03F 7/0005 430/4 |
| 2005/0026050 A1* | 2/2005 | Ozawa | G03F 1/50 430/5 |
| 2006/0204859 A1* | 9/2006 | Leidy | G03F 7/70466 430/5 |
| 2016/0290796 A1* | 10/2016 | Levy | G01N 21/9501 |

* cited by examiner

*Primary Examiner* — Steven Whitesell Gordon
(74) *Attorney, Agent, or Firm* — Andrew R. Ralston; Charles A. Brill; Frank D. Cimino

(57) ABSTRACT

Methods and apparatus to control grayscale lithography are disclosed. A disclosed example apparatus for adjusting a grayscale lithography process includes an optical measurement device to optically measure portions of a patterned wafer, and a processor to calculate a profile based on the measured portions, and to determine an adjustment of the grayscale lithography process based on the calculated profile. The disclosed apparatus also includes an adjuster to control the grayscale lithography process based on the adjustment.

26 Claims, 8 Drawing Sheets

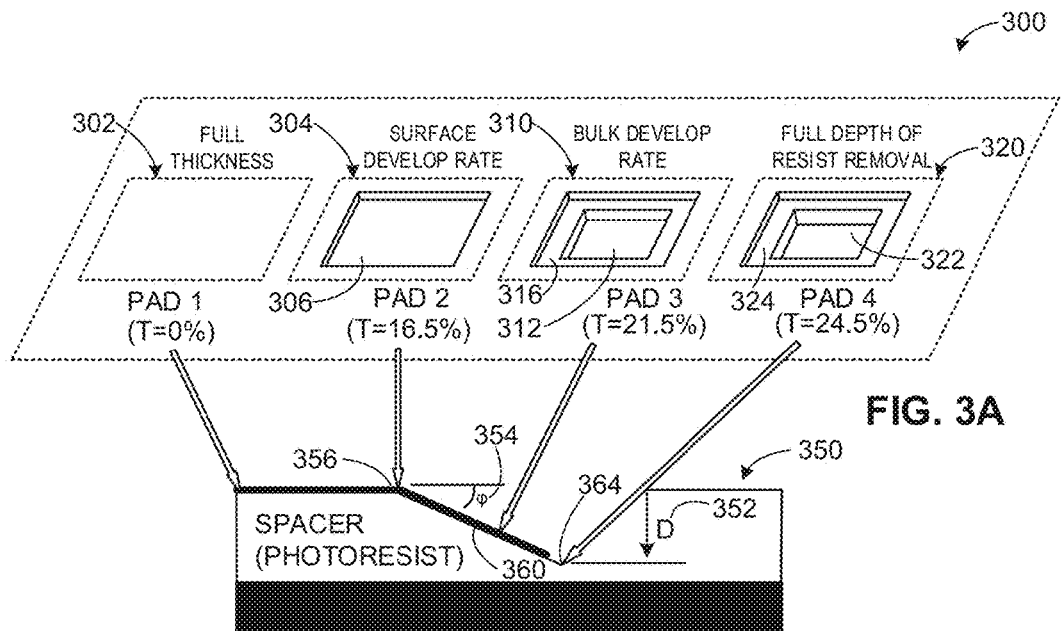
FIG. 3A
FIG. 3B
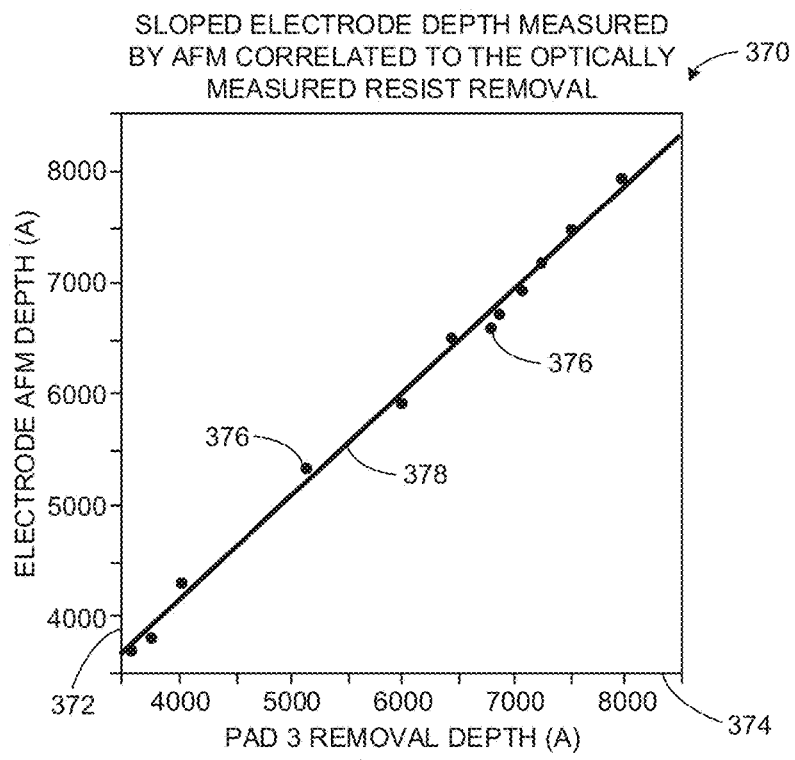
FIG. 3C

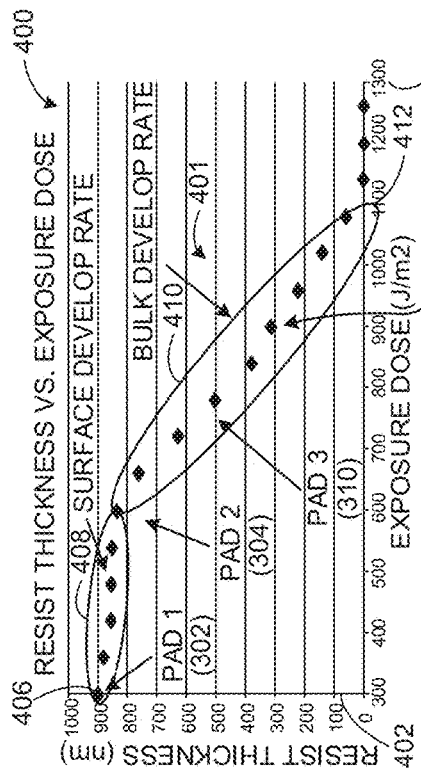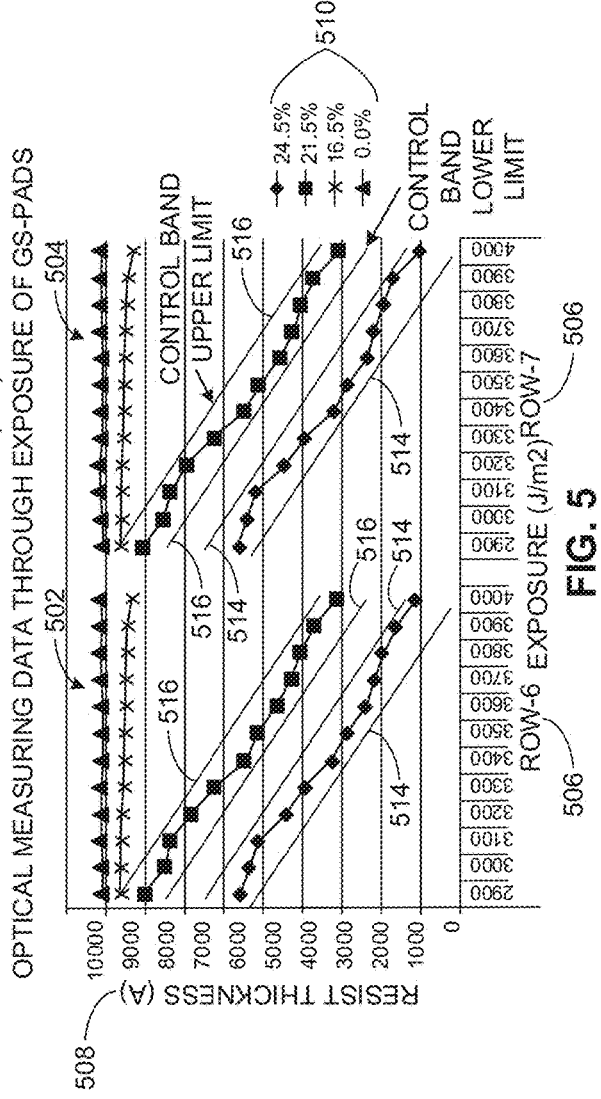

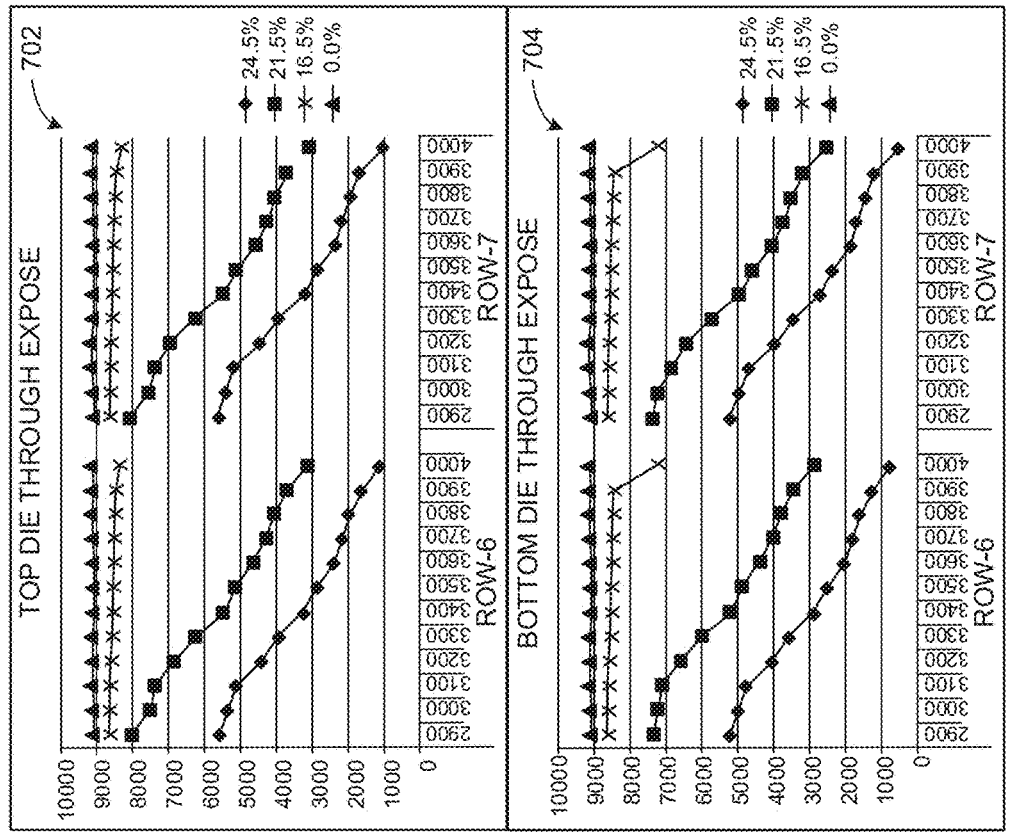
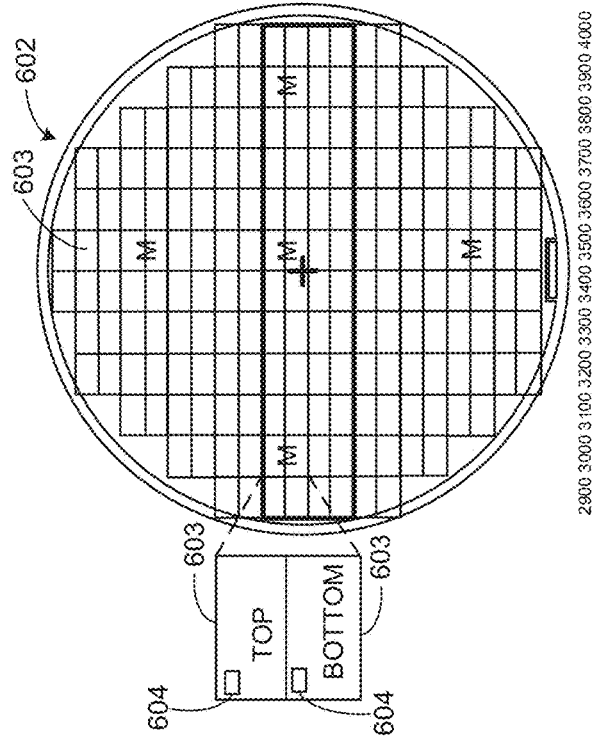
FIG. 6
FIG. 7

METHODS AND APPARATUS TO CONTROL GRAYSCALE PHOTOLITHOGRAPHY

FIELD OF THE DISCLOSURE

This disclosure relates generally to photolithography, and, more particularly, to methods and apparatus to control grayscale photolithography.

BACKGROUND

In recent years semiconductor devices and microelectromechanical systems have been fabricated with three-dimensional (3-D) features (e.g., fabricated device features), such as inclined or ramped surfaces using grayscale photolithography. In such examples, the inclined surfaces may be implemented as semiconductor or microelectromechanical device features and/or shapes. To produce such 3-D structures, the grayscale photolithography controls a degree to which a resist layer is exposed to incident light energy. In some known examples, higher intensity exposure removes an increased amount of the resist layer.

However, dimensional process control of inclined or ramped surfaces defined by such processes can be difficult. Typically, measured dimensional or tolerance data to adjust the photolithographic process is not obtained until after die and/or wafer fabrication is completed and, thus, is only available for post-production process adjustments. Further, known measuring techniques to measure features for control purposes can be both time and labor intensive. In particular, some known measuring techniques include use of a profilometer, which can entail relatively long cycle times.

BRIEF DESCRIPTION OF THE DRAWINGS

FIG. 3A is an isometric view of an example grayscale photolithography pattern in accordance with the teachings of this disclosure that may be produced and utilized by the example process adjustment system of FIG. 2.

FIG. 3B depicts a produced inclined profile that is shown in relationship to example pads of the photolithography pattern of FIG. 3A.

FIG. 3C is a graph depicting correlation of electrode depth that may be implemented in the examples disclosed herein.

FIG. 4 is a graph depicting an example profile that may be calculated by the examples disclosed herein.

FIG. 5 depicts example measurement data that may be utilized by the examples disclosed herein to monitor a process.

FIG. 6 depicts an example wafer having multiple die in which the examples disclosed herein may be implemented.

FIG. 7 illustrates example characterization across exposure dose that may be collected with the example wafer of FIG. 6.

Figure 1A:
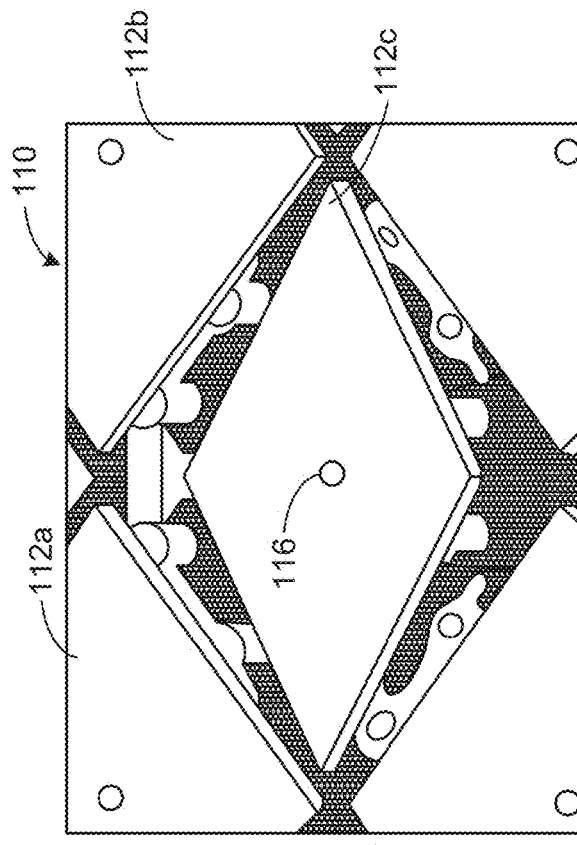
FIGS. 1A-1C illustrate inclined or ramped semiconductor or microelectromechanical structures that may be produced by the examples disclosed herein.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Methods and apparatus to control grayscale photolithography are disclosed. Some known semiconductor fabrication processes employ a grayscale photolithography process that varies the photoresist removal depth at a sufficient resolution to define a three-dimensional (3-D) feature, such as an inclined or ramped feature (e.g., a ramped semiconductor or microelectromechanical device feature). However, accurate control of producing such 3-D features can be difficult to achieve. In particular, process characterization of these known lithography processes are typically done after fabrication of a production wafer containing numerous die instead of during fabrication.

The examples disclosed herein enable highly accurate in-line (e.g., mid-process, mid-fabrication, etc.) control of grayscale photolithography, thereby enabling significantly tighter dimensional control of fabricated 3-D features (e.g., ramped, inclined and/or curved features). As a result, the examples disclosed herein can enable relatively narrow fabrication tolerances of semiconductor devices or structures and, thus, can enable highly accurate dimensional control. Further, the examples disclosed herein can increase yields of fabricated semiconductor or microelectromechanical devices by enabling inline automated adjustments of photolithography processes. These adjustments can adapt the photolithography process for parameters including, but not limited to variation in materials, thickness, light variation, reticle variation and/or manufacturing tolerances, etc.

The examples disclosed herein utilize patterns (e.g., developed patterns) that include grayscale pads (e.g., grayscale metrology pads) in some examples to accurately control a grayscale lithography process. In particular, these pads have different depths and can be defined on multiple die of the wafer during a fabrication process of the wafer.

According to the examples disclosed herein, depths of the metrology pads are optically measured so that a profile of the grayscale process is calculated to adjust the lithography process. In particular, numerous parameters of the grayscale process are monitored and adjusted for (e.g., inline control of the grayscale photolithography process) by taking optical measurements of depths (e.g., measured removal depth) of the pads so that the aforementioned profile can be calculated. These parameters of the grayscale photolithography process can be adjusted to include optical mask characteristics or placement, reticle dimensional variances, material variances, light emission variances, batch-to-batch variability, resist variance, etc. In some examples, a drift (e.g., a die-to-die drift, a wafer-to-wafer drift, a wafer batch drift, etc.) of the grayscale lithography process is calculated so that the drift can be adjusted accordingly with a calculated target profile.

As used herein, the term "profile" can refer to a function, relationship, multivariable relationship/fit, tabular relationship, curve and/or mathematical relationship that characterizes a behavior of a process or variances associated with the process. As used herein, the term "drift" can refer to a shift and/or movement of a characteristic behavior or function over time. As used herein, the terms "pattern" or "grayscale photolithography pattern" can refer to a fabrication of sloped or 3-D features created with sub-resolution reticle features. As used herein, the terms "three-dimensional" and "3-D" in the context of fabrication can refer to features having defined gradients or angular/ramped surfaces.

As used herein, the term "grayscale" or "GS" can refer to a process (e.g., a 3-D lithography process) and/or feature that encompasses gradients or angular/ramped surfaces in photoresist in contrast to a 2-D lithography process that produces only vertical walls/structures (e.g., a zero or full depth photoresist patterning process). As used herein, the terms "optical measurement" or "optically measuring" can refer to a methodology and/or process that is associated with measuring wavelengths and/or a shift in wavelength of light reflected such as spectroscopic ellipsometry or dual beam spectrometry from a surface, a feature and/or a component.

Figure 1B:
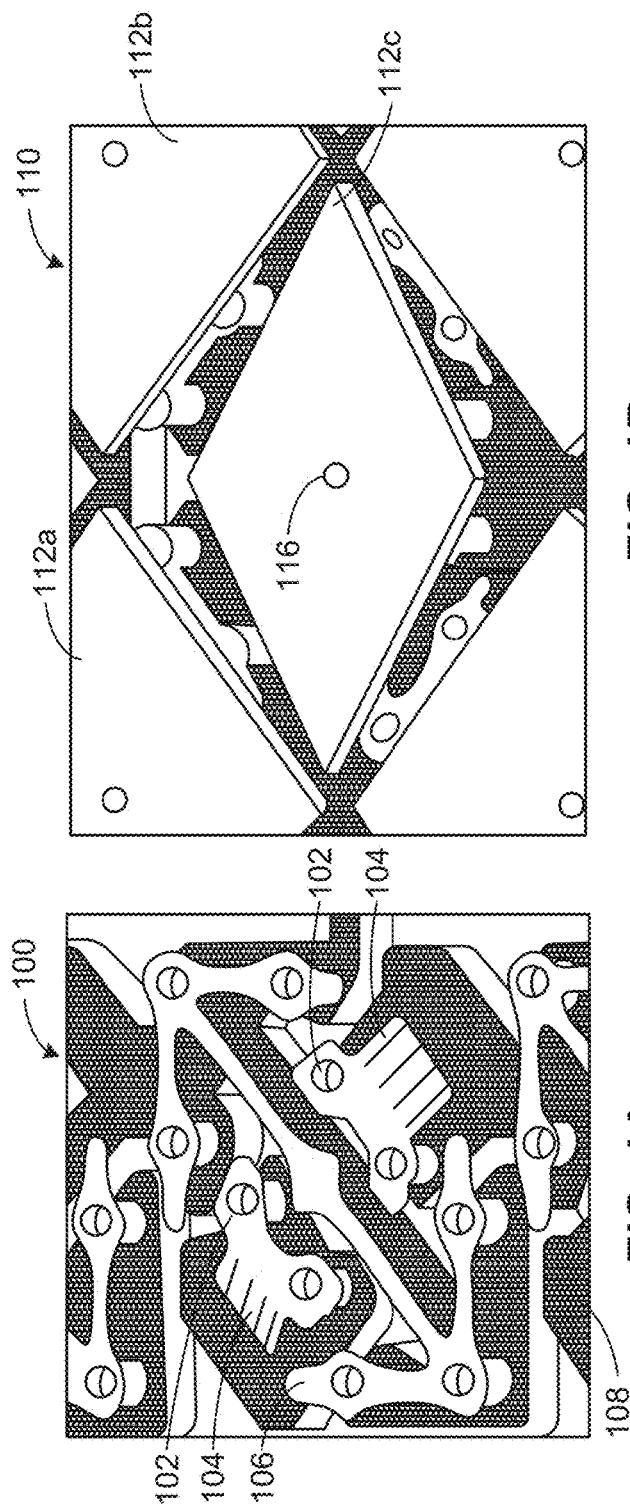
Figure 1C:
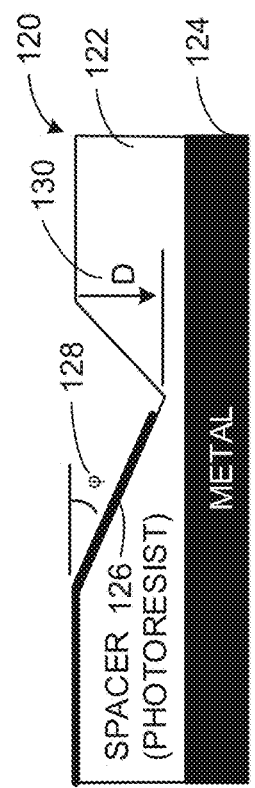

FIGS. 1A-1C illustrate inclined or ramped semiconductor structures by which the examples disclosed herein may be implemented to accurately produce. Turning to FIG. 1A, an example fabricated structure 100 includes fabricated electrodes 102 having ramped/sloped or angled portions (e.g., ramped or angled 3-D portions) 104. The example fabricated structure 100 also includes fabricated springs 106. In this example, the electrodes 102 are fabricated onto or within a substrate (e.g., a substrate metal layer, a substrate layer, etc.) 108.

To define the electrode 102 and the corresponding sloped profile 104, the substrate 108 is first coated with a photoresist (e.g., a spacer) 122 (shown in FIG. 1C), and then the resist is patterned with a grayscale photolithography process. The angled profile 104 is created by partially exposing the photoresist. In particular, the electrode 102 is produced by depositing metal over the angled profile 104, and, subsequently, the electrode metal is patterned through a separate photolithography and metal etch process.

FIG. 1B depicts another fabricated structure 110, which is fabricated on top of the fabricated structure 100 of FIG. 1A. The fabricated structure 110, which is a micron-scale movable multi-segment mirror for a light projector die in this example, includes movable mirror elements 112 (hereinafter 112a, 112b, 112c, etc.). In this example, the mirror elements 112 are each supported at their respective pivot points (e.g., rotational points, etc.) 116. In this example, the mirror elements are each moved by the electrodes 102 (e.g., to project an image and/or video) and the flat and angled portions 104 enable this movement based on their geometry. In the view of FIG. 1B, the mirror element 112c is depicted as pivoted away from a default centered orientation (e.g., a non-rotated orientation, a non-zero angle orientation).

Turning to FIG. 1C, a cross-sectional representation of dimensions associated with fabricated structures produced by grayscale photolithography process is shown. According to the illustrated view of FIG. 1C, a fabricated structure 120 is shown. The fabricated structure 120 includes the aforementioned photoresist layer 122 and a metal conductor layer 124 (e.g., the substrate 108). According to view of FIG. 1C, a ramped profile 126 (e.g., the sloped profiled 104) is defined in the resist layer 122 and includes both a respective angle 128 and a depth 130.

In contrast to the examples of FIGS. 1A-1C, the examples disclosed below enable relatively tight controls of both the angle 128 and the depth 130 by adjusting at least one photolithography parameter based on optically measuring portions of developed resist patterns during fabrication of multiple die onto a wafer, for example. Accordingly, the examples disclosed below are able to produce highly accurate fabrication of 3-D features based on these adjustments.

Figure 2:
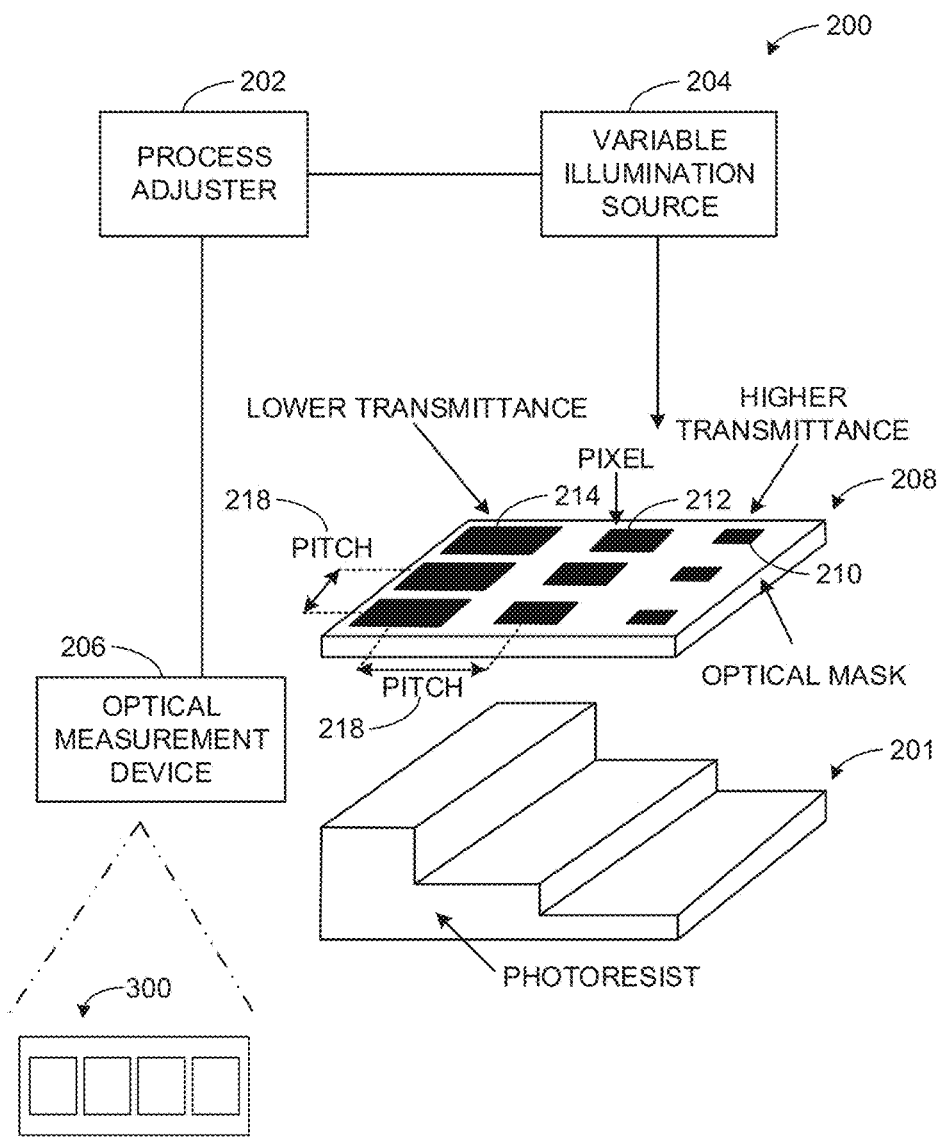
FIG. 2 is a schematic overview of an example grayscale photolithography process adjustment system in accordance with the teachings of this disclosure.

FIG. 2 is an overview of an example grayscale photolithography process adjustment system 200 in accordance with the teachings of this disclosure. The process adjustment system 200 of the illustrated example is implemented to define an inclined profile onto a photoresist 201 with accurate dimensional and tolerance control. The example process adjustment system 200 includes a process adjuster 202, a variable illumination source (e.g., an exposure dose source, an adjustable illumination source, etc.) 204 and an optical measurement device (e.g., an optical thickness measurement device, a metrology measuring device, a spectral ellipsometer, double beam spectrometer, interferometer, etc.) 206. In this particular example, the photolithography process adjustment system 200 also includes an optical mask 208, which includes first transmittance reticles or windows (e.g., chrome features, chrome reticles, windows with chrome or clear sub-resolution features, etc.) 210, intermediate transmittance windows 212, and tertiary transmittance windows 214, all of which are separated by respective pitch distances 218.

To define a 3-D inclined or ramped feature onto the photoresist 201, the variable illumination source 204 of the illustrated example provides light and/or energy to the optical mask 208. In particular, light is emitted through the optical mask 208 to define the inclined profile of the photoresist 201. Accordingly, the pitch distances 218 control a resolution of the inclined profile and a significantly high resolution can define a ramped or curved profile. According to the illustrated example, the variable illumination source 204 and the optical mask 208 are also used to develop an exposed pattern in addition to the inclined profile. In some examples, and as will be described in connection with FIGS. 3A-3C below, the developed pattern includes multiple pads of varying respective depths that are defined by varying transmittance levels of light from the variable illumination source 204 via the optical mask 208.

To adjust processes associated with defining a depth of ramped and/or curved profiles of the photoresist 201 and, as will be discussed in detail below in connection with FIGS. 3A-10, the optical measurement device 206 of the illustrated example optically measures portions (e.g., depth and/or thickness of separate grayscale pads) of the aforementioned developed patterns produced onto the photoresist 201, such as an example grayscale photoresist pattern 300 described below in connection with FIG. 3. In this example, the optical measurement device 206 measures reflected light intensity or a change in light polarization across a spectrum to calculate a thickness of photoresist removed. The aforementioned measurements may be made by spectroscopic ellipsometry or dual beam spectrometry. Accordingly, the optical measurements are provided to the example process adjuster 202 so that the process adjuster 202 can adjust at least one parameter of the grayscale lithography process and/or the fabrication process.

In some examples, the process adjuster 202 adjusts a value and/or magnitude of an exposure dose from the variable illumination source 204 for more accurate control of a depth and/or dimensions associated with a ramped profile. In some examples, the process adjuster 202 evaluates and adjusts for parameters associated with the optical mask 208 (e.g., transmittance properties of the optical mask 208, the pitch distances 218, etc.). Additionally or alternatively, the process adjuster 202 evaluates and adjusts for properties (e.g., material variances, thickness ranges, unevenness, etc.) of the photoresist 201.

While the examples disclosed herein are shown in relationship to grayscale photolithography, the examples disclosed herein may be applied to any photolithography, etching, and/or fabrication process that generates 3-D structures (e.g., ramped, curved and/or inclined 3-D structures).

FIG. 3A is an isometric view illustrating the aforementioned example grayscale photoresist pattern 300 in accordance with the teachings of this disclosure that may be produced and utilized for process adjustments by the example process adjustment system 200 of FIG. 2. The example photoresist pattern 300 of FIG. 3A includes a first pad (e.g., a rectangular or square pad) 302, which represents little or no exposure to light energy, and a second pad 304 with a corresponding exposed region 306. In this example, the second pad 304 represents a photoresist surface development rate. The photoresist pattern 300 also includes a third pad 310 with an exposed region 312, as well as a transition region 316. The pad 310 is positioned adjacent the second pad 304 and represents a photoresist bulk development rate. In some examples, the example grayscale photolithography pattern 300 also includes a fourth pad 320 with a full depth removal portion 322 and a corresponding transition region 324. As can be seen in the illustrated view of FIG. 3A, example transmittance percentage values are shown. However, these transmittance values are only examples and any appropriate values may be utilized, as appropriate, to an application.

In this example, each of the pads 302, 304, 310, 320 are approximately 30 microns in width and height with depths between approximately 0.01 to 0.5 microns. However, any appropriate dimensions or size scales may be used.

According to the illustrated example, depths of each of the pads 302, 304, 310, 320 are optically measured to calculate or determine a profile (e.g., a characterization profile, a correlation profile, a process control profile, etc.) that is used to adjust at least one parameter associated with a respective grayscale photolithography process.

While the pads 302, 304, 310, 320 of the illustrated example are shown arranged in a linear pattern/arrangement and in close relative proximity to one another, the pads 302, 304, 310, 320 can be arranged in a square or rectangular pattern, a triangular pattern (for examples with three pads), or placed on distinct regions (e.g., opposite ends, different portions, separate portions, etc.) of a die. While the pads 302, 304, 310, 320 are shown with a substantially rectangular overall shape, the pads 302, 304, 310, 320 may be any appropriate shape including, but not limited, circular, polygonal, pentagonal, hexagonal, etc.

FIG. 3B depicts an inclined or ramped feature (e.g., an inclined fabricated feature, a 3-D grayscale feature, a produced pattern, etc.) 350 that is shown in relationship to the example pads 302, 304, 310 320 of the photoresist pattern 300 of FIG. 3A to illustrate how respective depths of the pads 302, 304, 310 320 correspond to inclined features. In particular, the inclined feature 350 can be produced accurately according to the examples disclosed herein. The inclined feature 350 includes a respective depth 352 with a respective angle (e.g., an incline angle) 354. The inclined feature 350 also includes an upper surface 356 that corresponds to the first pad 302, an incline 360 that corresponds to the pad 310 and the pad 304, and a region 364 that corresponds to the pad 320.

FIG. 3C is a graph 370 depicting correlation of electrode depth that may be implemented in the examples disclosed herein. The example graph 370 includes a vertical axis 372 that represents an electrode depth in angstrom (A) and a horizontal axis 374 that represents removal depth in angstrom. As can be seen in the illustrated example data points 376 are used to fit a line 378 (e.g., the line 378 if fit using linear regression.

FIG. 4 is a graph 400 depicting an example profile 401 that may be calculated or determined by the examples disclosed herein. In particular, the example profile 401 illustrates a relationship between optically measured depths of the pads 302, 304, 310 described above in connection with FIG. 3 with optical transmittance levels and/or exposure doses. The graph 400 of FIG. 4 includes a vertical axis 402 that represents resist thickness in nanometers (nm) and horizontal axis 404 that represents exposure dose in Joules per meter squared ($J/m^2$).

According to the illustrated example of FIG. 4, the profile 401 includes a full thickness portion 406 corresponding to the pad 302, and a surface develop rate portion 408 that corresponds to differences between depths of the pad 302 and the pad 304. Further, the example profile 401 includes a bulk develop rate portion 410 that exhibits a linear sloped line representing differences between the pad 304 and the pad 310 (e.g., a linear relationship). Further, the example profile 401 includes a complete resist removal portion 412.

To calculate the example profile 401, depths of the pads 304, 310, 320 in relation to a reference full thickness photoresist or unexposed region of the pad 302 are utilized to define the sloped line that encompasses the bulk develop rate portion 410. Additionally or alternatively, the surface develop rate portion 408 is used to define an initial start of the bulk develop rate portion 410. In some examples, the sloped line is calculated by finding points of the profile 401 where the bulk develop rate portion 410 intersects both the surface develop rate portion 408 and the complete resist removal portion 412.

FIG. 5 depicts example measurement data that may be utilized by the examples disclosed herein to monitor a process using multiple profiles to characterize a grayscale photolithography process over exposure. In particular, a first graph 502 and a second graph 504 illustrate how the examples disclosed herein may be used to monitor and control a 3-D fabrication grayscale photolithography process amongst multiple developed patterns of different respective fabricated devices.

According to the illustrated example, both the first graph 502 and the second graph 504 include respective horizontal axes 506 that represent exposure levels and a vertical axis 508 that represents resist thickness. In this example, a legend 510 represents optical transmittance percentages. Further, the graphs 502, 504 include a lower control band 514 and an upper control band 516, both of which are used to validate measured profiles of multiple grayscale patterns that indicate deviation(s) from desired dimensional control of 3-D features.

In some examples, the lower control band 514 and the upper control band 516 are used to determine an error of a reticle of an optical mask. Additionally or alternatively, a determination of photoresist batch-to-batch consistency is monitored and/or calculated based on changes or shifts of the first graph 502 or the second graph 504 relative to the lower control band 514 or the upper control band 516.

FIG. 6 illustrates an example wafer 602 having multiple die 603 in which the examples disclosed herein may be implemented. In this example, pad locations 604 are shown relative to the corresponding die 603. In particular, the pad locations 604 are provided with the developed grayscale pattern 300 with the pads 302, 304, 310, each of which are to be optically measured to calculate a profile, such as the profile 401 of FIG. 4. In turn, the calculated profile is monitored for changes and/or deviations from a specification (e.g., threshold bands or tolerances of the specification). In this example, pairs of "top" and "bottom" die are monitored in conjunction with one another.

FIG. 7 illustrates example monitoring that may be implemented with the example wafer 602 of FIG. 6. According to the illustrated example of FIG. 7, graphs 702 represent "top" die of the wafer 602 while graphs 704 represent "bottom" die of the wafer 602. As a result, shifts or irregularities between the "bottom" die as well as the top "die" are monitored, thereby enabling consistent and effective determination of variation related to optical masks and/or their corresponding reticle feature consistency. In some examples, "top" and "bottom" pairs are compared to other "top" and "bottom" pairs to adjust and/or control a grayscale lithography process. Additionally, multiple sets of measurement pads on the same reticle can be used to evaluate exposure system uniformity.

Figure 8:
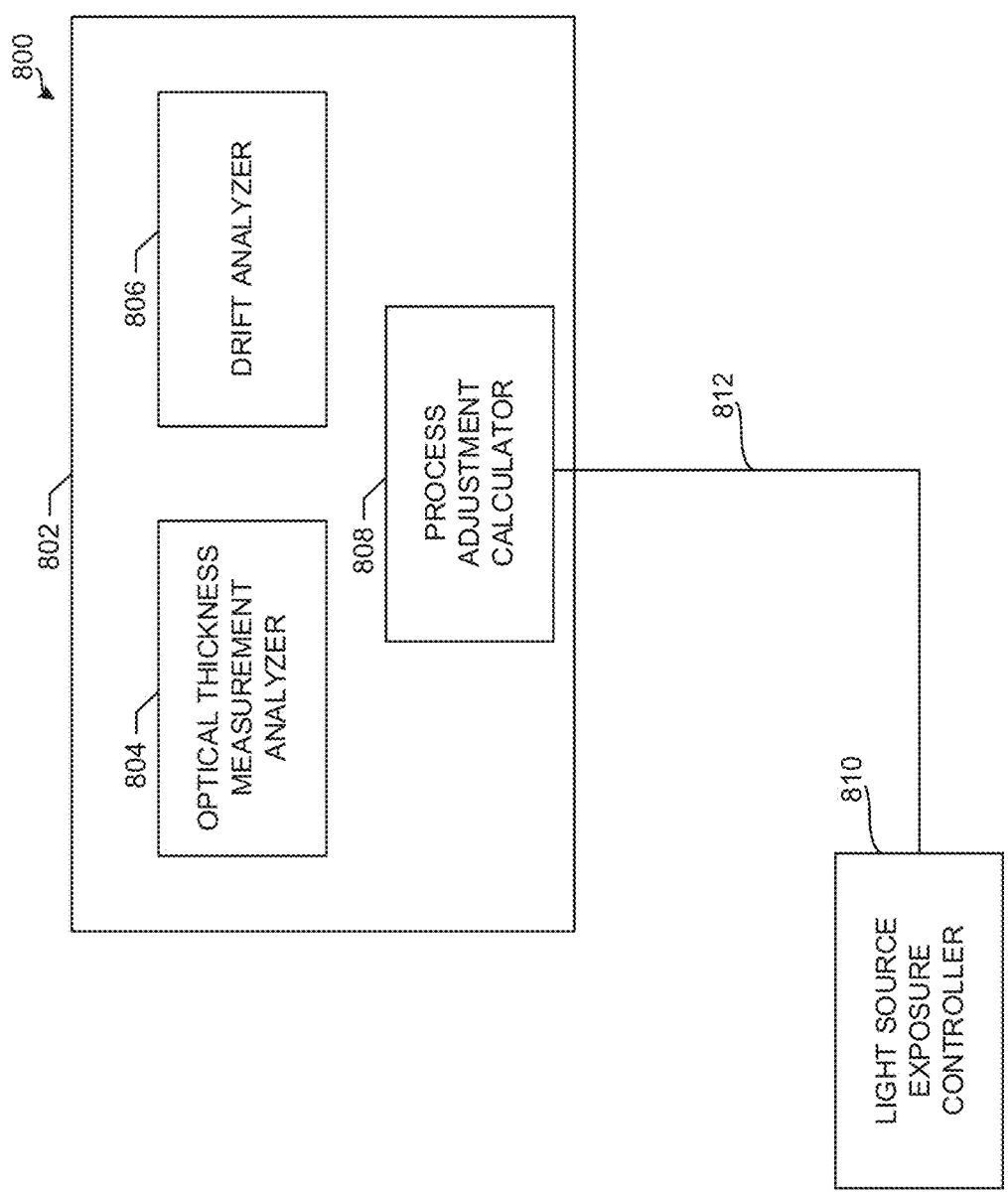
FIG. 8 is an example grayscale photolithography process monitoring system that may be used to implement the examples disclosed herein.

FIG. 8 illustrates an example photolithography process monitoring system 800 that may be used to implement the examples disclosed herein. In particular, the process monitoring system 800 may be implemented in the process adjuster 202 shown in FIG. 2. The process monitoring system 800 of the illustrated example includes a grayscale lithography process analyzer 802 including an optical thickness measurement analyzer 804, a drift analyzer 806, and a process adjustment calculator 808. Further, the example process monitoring system 800 includes a light source exposure controller 810 that is communicatively coupled to the example process adjustment calculator 808 via a communication line 812.

To characterize a grayscale lithography process, the optical thickness measurement analyzer 804 of the illustrated example utilizes measurements made by the optical measurement device 206. In this example, the optical measurement device 206 optically measures portions of the developed photoresist pattern 300 to calculate a profile (e.g., the profile 401). In particular, the corresponding depths of the first pad 302, the second pad 304 and the third pad 310 are optically measured based on spectral ellipsometry or reflectance spectrometry to calculate the profile. In other examples, optical measurements of the fourth pad 320 are also used to calculate the profile. In some examples, the example optical thickness measurement analyzer 804 determines a surface develop rate and a bulk develop rate, both of which may be characterized as relatively straight lines (e.g., fitted lines, regression defined lines, etc.) having corresponding slopes. In some examples, the profile is calculated to adjust exposure of a resist. Additionally or alternatively, the profile is calculated to evaluate an optical mask or a reticle. In other examples, the profile is calculated to evaluate resist material and/or batches of resist material. In some examples, prior material measurements and/or associated data are provided to the optical thickness optical thickness measurement analyzer 804.

To determine an adjustment of the grayscale lithography process, the example process adjustment calculator 808 utilizes the aforementioned calculated profile to determine how to adjust the grayscale lithography process. For example, the process adjustment calculator 808 can calculate a change in exposure dose by the variable illumination source 204 to more accurately control resist removal depth (e.g., a slope of a bulk develop rate) of the grayscale lithography process. In some examples, the optical mask 208 is rejected or redesigned to pattern the correct profile for a given exposure dose.

To adjust the grayscale lithography process, the process adjustment calculator 808 and/or the photolithography exposure controller 812 cause an adjustment of the grayscale lithography process based on the determined adjustment by the example process adjustment calculator 808. In this example, the process adjustment calculator 808 directs the process adjuster 202 and/or the light source exposure controller 810 to vary incident light exposure dose.

In some examples, the drift analyzer 806 determines a potential drift of the grayscale lithography process. For example, the drift analyzer 806 can determine that depth removal using the optical mask 208 is shifting based on multiple resist batches and/or drifting related to the optical mask 208. As a result, the drift analyzer 806 may cause further adjustments of the grayscale lithography process by the process adjustment calculator 808 and/or the light source exposure controller 810. In some examples, measurements of the first pad 302, the second pad 304 and the third pad 310 are used to determine production batch shifts and/or reworks (e.g., stripping of a resist for later re-application, etc.). Additionally or alternatively, the measurements are used to determine batch-to-batch adjustments of the grayscale lithography process. In other words, the examples disclosed herein may be used to shift the grayscale lithography process.

While an example manner of implementing the grayscale photolithography process adjustment system 200 of FIG. 2 is illustrated in FIG. 8, one or more of the elements, processes and/or devices illustrated in FIG. 8 may be combined, divided, re-arranged, omitted, eliminated and/or implemented in any other way. Further, the example optical thickness measurement analyzer 804, the example drift analyzer 806, the example process adjustment calculator 808, the example light source exposure controller 810 and/or, more generally, the example process monitoring system 800 of FIG. 8 may be implemented by hardware, software, firmware and/or any combination of hardware, software and/or firmware. Thus, for example, any of the example optical thickness measurement analyzer 804, the example drift analyzer 806, the example process adjustment calculator 808, the light source exposure controller 810 and/or, more generally, the example process monitoring system 800 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, optical thickness measurement analyzer 804, the example drift analyzer 806, the example process adjustment calculator 808 and/or the example light source exposure controller 810 is/are hereby expressly defined to include a non-transitory computer readable storage device or storage disk such as a memory, a digital versatile disk (DVD), a compact disk (CD), a Blu-ray disk, etc. including the software and/or firmware. Further still, the example photolithography process monitoring system 800 of FIG. 8 may include one or more elements, processes and/or devices in addition to, or instead of, those illustrated in FIG. 8, and/or may include more than one of any or all of the illustrated elements, processes and devices.

Figure 9:
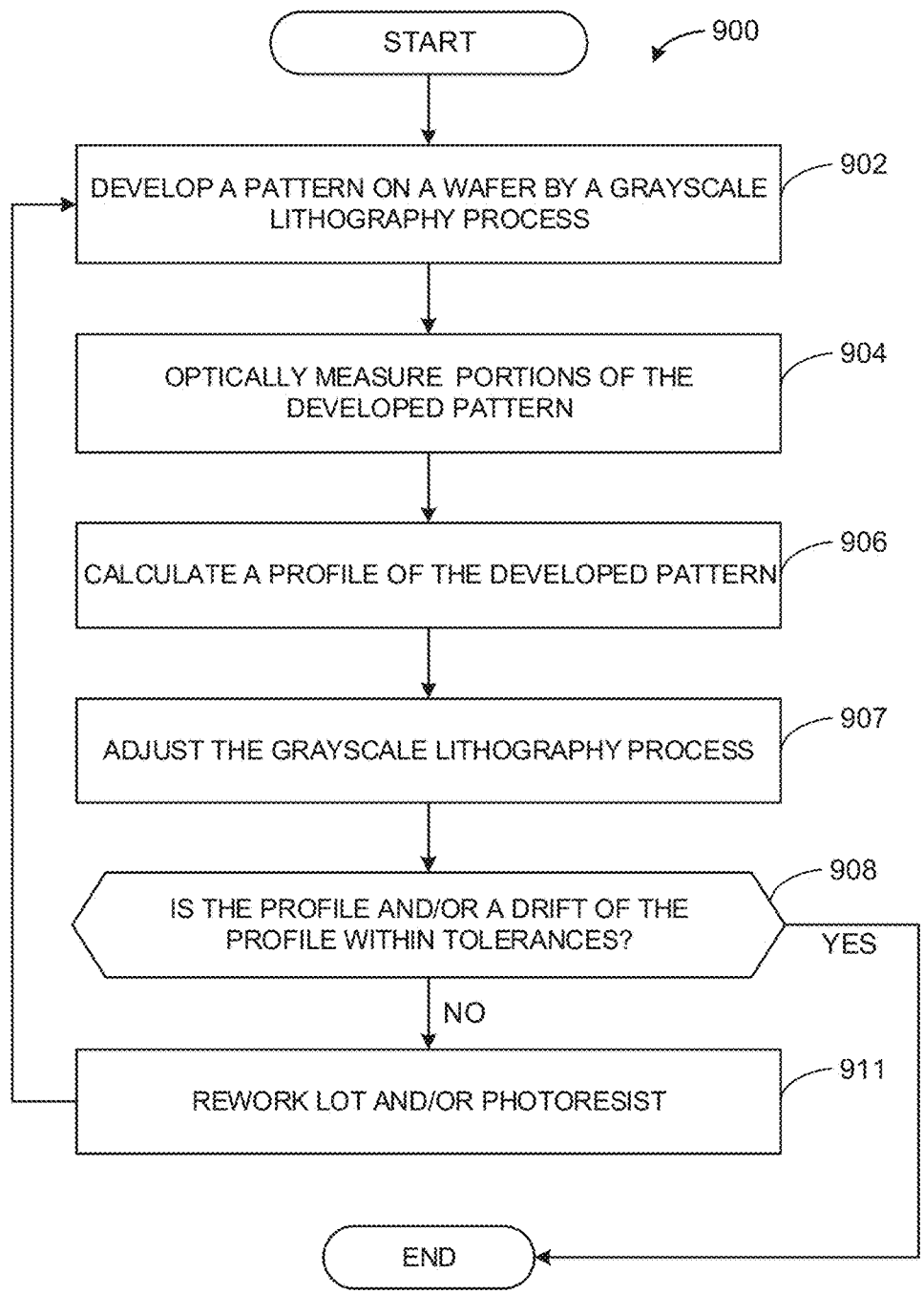
FIG. 9 is a flowchart representative of machine readable instructions which may be executed to implement the example process monitoring system of FIG. 9.

A flowchart representative of example machine readable instructions for implementing the process adjustment system 200 of FIG. 2 is shown in FIG. 9. In this example, the machine readable instructions comprise a program for execution by a processor such as the processor 1012 shown in the example processor platform 1000 discussed below in connection with FIG. 10. The program may be embodied in software stored on a non-transitory computer readable storage medium such as a CD-ROM, a floppy disk, a hard drive, a digital versatile disk (DVD), a Blu-ray disk, or a memory associated with the processor 1012, but the entire program and/or parts thereof could alternatively be executed by a device other than the processor 1012 and/or embodied in firmware or dedicated hardware. Further, although the example program is described with reference to the flowchart illustrated in FIG. 9, many other methods of implementing the example grayscale lithography process adjustment system 200 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIG. 9 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

The program of FIG. 9 begins as photoresist pattern 300 and the feature 350 are defined on a wafer (e.g., a die of the wafer) by a grayscale photolithography process, for example (block 902). In particular the pattern 300 includes, pads, such as the pads 302, 304, 310, all of which are defined onto a portion of the die in a relatively linear arrangement in this example.

According to the illustrated example, the optical measurement device 206 optically measures portions (e.g., pads) of the developed photoresist pattern 300 (block 904). In particular, the optical measurement device 206 measures depths of each of the pads 302, 304, 310 based on reflected wavelengths from the pads 302, 304, 310.

Next, the optical thickness measurement analyzer 804 of the illustrated example calculates a profile of the inclined feature 350 based on the measurements of the grayscale metrology pads (block 906). In this example, the optical thickness measurement analyzer 804 generates curves (e.g., linear curves) based on the measured depths of each of the pads 302, 304, 310. In some examples, a depth of the pad 320 is also measured.

According to the illustrated example, the process adjustment calculator 808 directs the process adjuster 202 and/or the light source exposure controller 810 to adjust the light exposure process (block 907). In this example, thickness/depth measurement errors are used to adjust a later production lot's exposure dose/level. Additionally or alternatively, the example process adjuster 202 adjusts a parameter such as exposure related to an optical mask, exposure tool's characteristics, and/or material batch selection, etc.

It is then determined whether the profile and/or a drift associated with the profile is within tolerances (e.g., error bands, tolerance bands, etc.) (block 908). If it is determined that the profile and/or the drift associated with the profile is not within tolerances (block 908), control of the process proceeds to block 911. Otherwise, the process ends.

In some examples, a production lot and/or a photoresist layer is reworked (block 911). In particular, an entire production lot of material, for example, may be reworked by stripping the photoresist layer. In some examples, a photoresist of a partially produced wafer, for example, may be stripped for re-application of the photoresist. Control of the process then returns to block 902.

Figure 10:
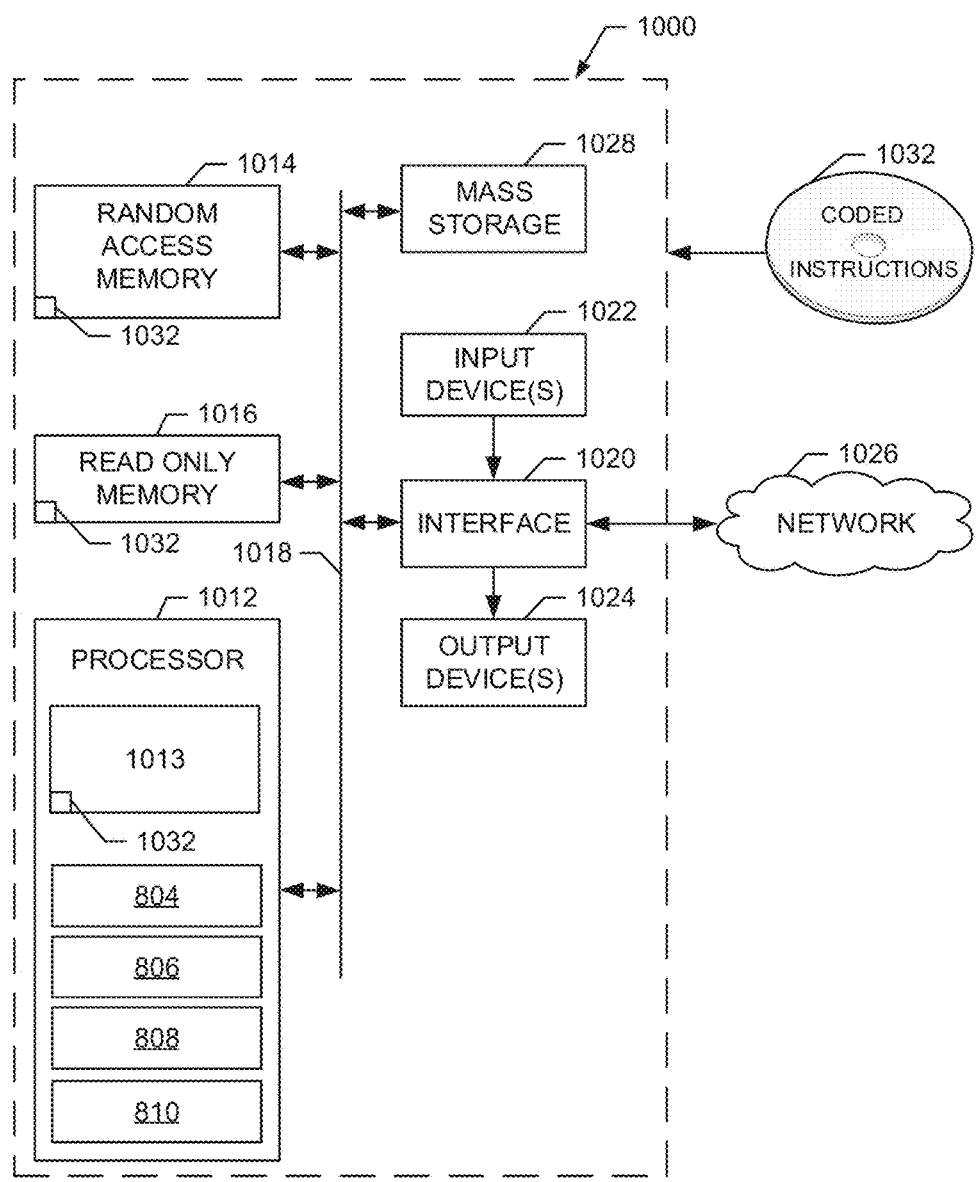
FIG. 10 is a block diagram of an example processing platform structured to execute the instructions of FIG. 9 to implement the example process monitoring system of FIG. 8.

FIG. 10 is a block diagram of an example processor platform 1000 capable of executing the instructions of FIG. 9 to implement the process adjustment system 200 of FIG. 2. The processor platform 1000 can be, for example, a server, a personal computer, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors or controllers from any desired family or manufacturer. The hardware processor may be a semiconductor based (e.g., silicon based) device. In this example, the processor 1012 implements the example optical measurement analyzer 804, the example drift analyzer 806, the process adjustment calculator 808 and the example light source exposure controller 810.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), and/or a PCI express interface.

In the illustrated example, one or more input devices 1022 are connected to the interface circuit 1020. The input device(s) 1022 permit(s) a user to enter data and/or commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1020 of the illustrated example, thus, typically includes a graphics driver card, a graphics driver chip and/or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID systems, and digital versatile disk (DVD) drives.

The coded instructions 1032 of FIG. 9 may be stored in the mass storage device 1028, in the volatile memory 1014, in the non-volatile memory 1016, and/or on a removable tangible computer readable storage medium such as a CD or DVD.

From the foregoing, it will be appreciated that example methods, apparatus and articles of manufacture have been disclosed that enable accurate control of grayscale photolithography processes. The examples disclosed also enable inline control of semiconductor or microelectromechanical process that involve 3-D structures by facilitating adjustments during fabrication of a wafer and/or a die.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. While the examples disclosed herein are shown in the context of grayscale photolithography, the example disclosed herein may be applied to any appropriate lithography, etching and/or fabrication process that transfers a photoresist grayscale profile into an underlying substrate (e.g., chemical etching, dry plasma etching, mechanical etching, etc.).

What is claimed is:

1. An apparatus for adjusting a grayscale lithography process, the apparatus comprising:
    an optical measurement device configured to optically measure a plurality of patterns of a patterned wafer, each pattern being associated on a one-to-one basis with a corresponding different die on the wafer and each pattern including a plurality of locations each having a different thickness of developed photoresist,
    a processor to:
        calculate a profile based on the measured locations, and determine an adjustment of the grayscale lithography process based on the calculated profile; and
    an adjuster to control the grayscale lithography process based on the adjustment.

2. The apparatus as defined in claim 1, wherein a developed pattern of the patterned wafer includes pads of varying respective depths.

3. The apparatus as defined in claim 2, wherein the developed pattern is defined by an adjustable illumination source onto the patterned wafer via an optical mask.

4. The apparatus as defined in claim 3, wherein the optical mask includes windows with at least one of opaque, chrome or clear sub-resolution features to locally modulate a transmittance of an exposure.

5. The apparatus as defined in claim 2, the processor is to calculate the profile based on optical measurements of the respective depths of the pads.

6. The apparatus as defined in claim 2, wherein the pads are sufficiently sized to be optically measured.

7. The apparatus as defined in claim 6, wherein the pads are arranged as an array on the patterned wafer.

8. The apparatus as defined in claim 1, wherein the profile includes a relationship pertaining to at least one of a bulk develop rate or a surface develop rate.

9. The apparatus as defined in claim 1, wherein the processor is to further calculate a drift of the grayscale lithography process.

10. The apparatus as defined in claim 1, wherein the pattern is defined in photoresist or the pattern is defined in photoresist and transferred to an underlying substrate via a chemical or dry plasma etching process.

11. The apparatus as defined in claim 1, wherein the plurality of patterns is a plurality of first patterns, and the optical measurement device is further configured to optically measure a plurality of second patterns of the patterned wafer, each second pattern being located on a same die as a corresponding one of the first patterns.

12. The apparatus as defined in claim 11, wherein the optical measurement device is further configure to determine a difference between first and second patterns on a same die.

13. A method for process control of a grayscale lithography process, the method comprising:
    defining a developed pattern on a wafer by varying transmittance of an exposure source to define a plurality of patterns of a patterned wafer, each pattern being associated on a one-to-one basis with a corresponding different die on the wafer and each pattern including a plurality of locations each having a different thickness of developed photoresist;
    optically measuring, via an optical thickness measurement device, features of the patterns;
    calculating, via a processor, a profile of the grayscale lithography process based on measuring the features; and
    adjusting an exposure of the wafer based on the profile.

14. The method as defined in claim 13, further including calculating a drift of the grayscale lithography process based on a measured removal depth of the developed pattern and calculated profile.

15. The method as defined in claim 13, wherein the defining the developed pattern includes defining pads of differing respective depths.

16. The method as defined in claim 15, wherein the calculating the profile is at least partially based on the respective depths of the pads.

17. The method as defined in claim 13, wherein the developed pattern is defined by a lithography process, or by transferring a pattern in photoresist to an underlying substrate via a chemical or dry plasma etching process.

18. The method as defined in claim 13, wherein the plurality of patterns is a plurality of first patterns, and defining the developed pattern includes varying transmittance of the exposure source to define a plurality of second patterns, each second pattern being located on a same die as a corresponding one of the first patterns, further comprising the optical measurement device optically measuring, via the optical thickness measurement device, features of the second patterns, and calculating the profile of the grayscale lithography process is also based on measuring the features of the second patterns.

19. The apparatus as defined in claim 18, wherein calculating the profile includes determining a difference between first and second patterns on a same die.

20. A tangible non-transitory machine readable medium comprising instructions, which when executed, cause a processor to at least:
calculate a profile of each of a plurality of patterns on a wafer based on optical thickness measurements of a plurality of locations within each of the patterns, each of the patterns being associated on a one-to-one basis with a different corresponding die on the wafer, and each of the locations having a different thickness of developed photoresist;
determine an adjustment of a grayscale lithography process based on the profile; and
adjust the grayscale lithography process based on the determined adjustment.

21. The tangible machine readable medium as defined in claim 20, wherein the pads have different respective depths.

22. The tangible machine readable medium as defined in claim 20, wherein the profile includes a linear line corresponding to the pattern that is based on at least one of a surface develop rate and a bulk develop rate.

23. The tangible machine readable medium as defined in claim 20, wherein the instructions cause the processor to determine a drift of the grayscale lithography process.

24. The tangible machine readable medium as defined in claim 20, wherein the instructions cause the processor to adjust the grayscale lithography process during fabrication of semiconductor or microelectromechanical devices on the wafer.

25. The tangible machine readable medium as defined in claim 20, wherein the plurality of patterns is a plurality of first patterns, and the instructions, when executed, further configure the processor to calculate a profile of each of a plurality of second patterns on the wafer based on optical thickness measurements of a plurality of locations within each of the second patterns, each second pattern being located on a same die as a corresponding one of the first patterns.

26. The tangible machine readable medium as defined in claim 25, wherein calculating the profile includes determining a difference between first and second patterns on a same die.

* * * * *